(12) United States Patent
Cao et al.

(10) Patent No.: US 12,040,525 B2
(45) Date of Patent: Jul. 16, 2024

(54) DOUBLE-DISC STRUCTURE FOR SELF-BIASED CIRCULATORS MONOLITHICALLY INTEGRATED ON SEMICONDUCTORS

(71) Applicant: Qorvo US, Inc., Greensboro, NC (US)

(72) Inventors: Yu Cao, Allen, TX (US); Yongjie Cui, Plano, TX (US); Soack Dae Yoon, Torrance, CA (US)

(73) Assignee: Qorvo US, Inc., Greensboro, NC (US)

( * ) Notice: Subject to any disclaimer, the term of this patent is extended or adjusted under 35 U.S.C. 154(b) by 491 days.

(21) Appl. No.: 17/360,383

(22) Filed: Jun. 28, 2021

(65) Prior Publication Data

US 2022/0416390 A1 Dec. 29, 2022

(51) Int. Cl.

| | |
|---|---|
| *H01P 1/387* | (2006.01) |
| *H01P 1/38* | (2006.01) |
| *H01P 5/12* | (2006.01) |
| *H04B 1/40* | (2015.01) |
| *H01L 29/16* | (2006.01) |
| *H01L 29/20* | (2006.01) |

(52) U.S. Cl.
CPC ............... *H01P 1/38* (2013.01); *H01P 1/387* (2013.01); *H01P 5/12* (2013.01); *H04B 1/40* (2013.01); *H01L 29/1608* (2013.01); *H01L 29/2003* (2013.01)

(58) Field of Classification Search
CPC .. H01P 1/387; H01P 1/383; H01P 1/38; H01P 1/32; H01P 1/36
See application file for complete search history.

(56) References Cited

U.S. PATENT DOCUMENTS

| | | | |
|---|---|---|---|
| 9,467,192 B2 * | 10/2016 | McCarthy | ............... H01P 1/387 |
| 2020/0153071 A1 * | 5/2020 | Cui | .................... H01L 21/8252 |

* cited by examiner

*Primary Examiner* — Stephen E. Jones
(74) *Attorney, Agent, or Firm* — Withrow & Terranova, P.L.L.C.

(57) ABSTRACT

A double-disc structure for self-biased circulators monolithically integrated on semiconductors is provided. A self-based circulator is attractive due to the great reduction in its size and weight compared to conventional circulators which have bulk permanent magnets. The development of miniaturized self-biased circulators enables monolithic integration of such circulators directly into monolithic integrated circuits (e.g., monolithic microwave integrated circuits (MMICs)) on a single chip and opens the door to full-duplex communication in radio frequency (RF) bands higher than Ka band, without suffering from the additional losses through connectors. This disclosure demonstrates a new double-disc structure by using two self-biased discs in a circulator device, which greatly improve its insertion loss, isolation, bandwidth, and power handling capability.

20 Claims, 10 Drawing Sheets

DOUBLE-DISC STRUCTURE FOR SELF-BIASED CIRCULATORS MONOLITHICALLY INTEGRATED ON SEMICONDUCTORS

FIELD OF THE DISCLOSURE

This application relates to radio frequency (RF) circulators in integrated circuits.

BACKGROUND

In radio frequency (RF) transceiver systems, a magnetic circulator is frequently used to enable simultaneous signal transmission and reception over a single antenna. The magnetic circulator routes the signals between a transmit port, an antenna port, and a receive port while providing isolation between the transmit port and the receive port. The magnetic circulator includes a permanent magnet which causes signals to pass through its material along one direction (a forward direction) while isolating signals along the opposite direction (a reverse direction), such that signals travel from the transmit port to the antenna port and from the antenna port to the receive port.

However, conventional circulators are typically required to be off-chip since they require a bulky permanent magnet mounted in a board or package. This greatly increases the size of the transmit/receive module in which the conventional circulator is provided. Efforts have been made to replace the permanent magnet of circulators with much smaller "self-biased" magnetic structures. However, the performance of these self-biased circulators has thus far been quite poor. In particular, insertion loss, which is a key performance parameter of a circulator, is very high for self-biased circulators. Accordingly, there is a need for self-biased circulators with improved performance.

SUMMARY

A double-disc structure for self-biased circulators monolithically integrated on semiconductors is provided. A self-based circulator is attractive due to the great reduction in its size and weight compared to conventional circulators which have bulk permanent magnets. The development of miniaturized self-biased circulators enables monolithic integration of such circulators directly into monolithic integrated circuits (e.g., monolithic microwave integrated circuits (MMICs)) on a single chip and opens the door to full-duplex communication in radio frequency (RF) bands higher than Ka band, without suffering from the additional losses through connectors. This disclosure demonstrates a new double-disc structure by using two self-biased discs in a circulator device, which greatly improve its insertion loss, isolation, bandwidth, and power handling capability.

An exemplary embodiment provides a self-biased magnetic circulator, comprising: a semiconductor wafer comprising a bottom surface and a top surface defining a circulator metal junction; a first magnetic disc disposed in a cavity formed in the bottom surface of the semiconductor wafer; and a second magnetic disc coupled to the top surface of the semiconductor wafer and disposed over the first magnetic disc.

Another exemplary embodiment provides an integrated circuit, comprising: a semiconductor device layer disposed on an insulating substrate; and a double-disc magnetic circulator, comprising: a first magnetic disc disposed in a cavity formed in the insulating substrate; and a second magnetic disc disposed over the first magnetic disc and over the semiconductor device layer.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

A double-disc structure for self-biased circulators monolithically integrated on semiconductors is provided. A self-based circulator is attractive due to the great reduction in its size and weight compared to conventional circulators which have bulk permanent magnets. The development of miniaturized self-biased circulators enables monolithic integration of such circulators directly into monolithic integrated circuits (e.g., monolithic microwave integrated circuits (MMICs)) on a single chip and opens the door to full-duplex communication in radio frequency (RF) bands higher than Ka band, without suffering from the additional losses through connectors. This disclosure demonstrates a new double-disc structure by using two self-biased discs in a circulator device, which greatly improve its insertion loss, isolation, bandwidth, and power handling capability.

Figure 1:
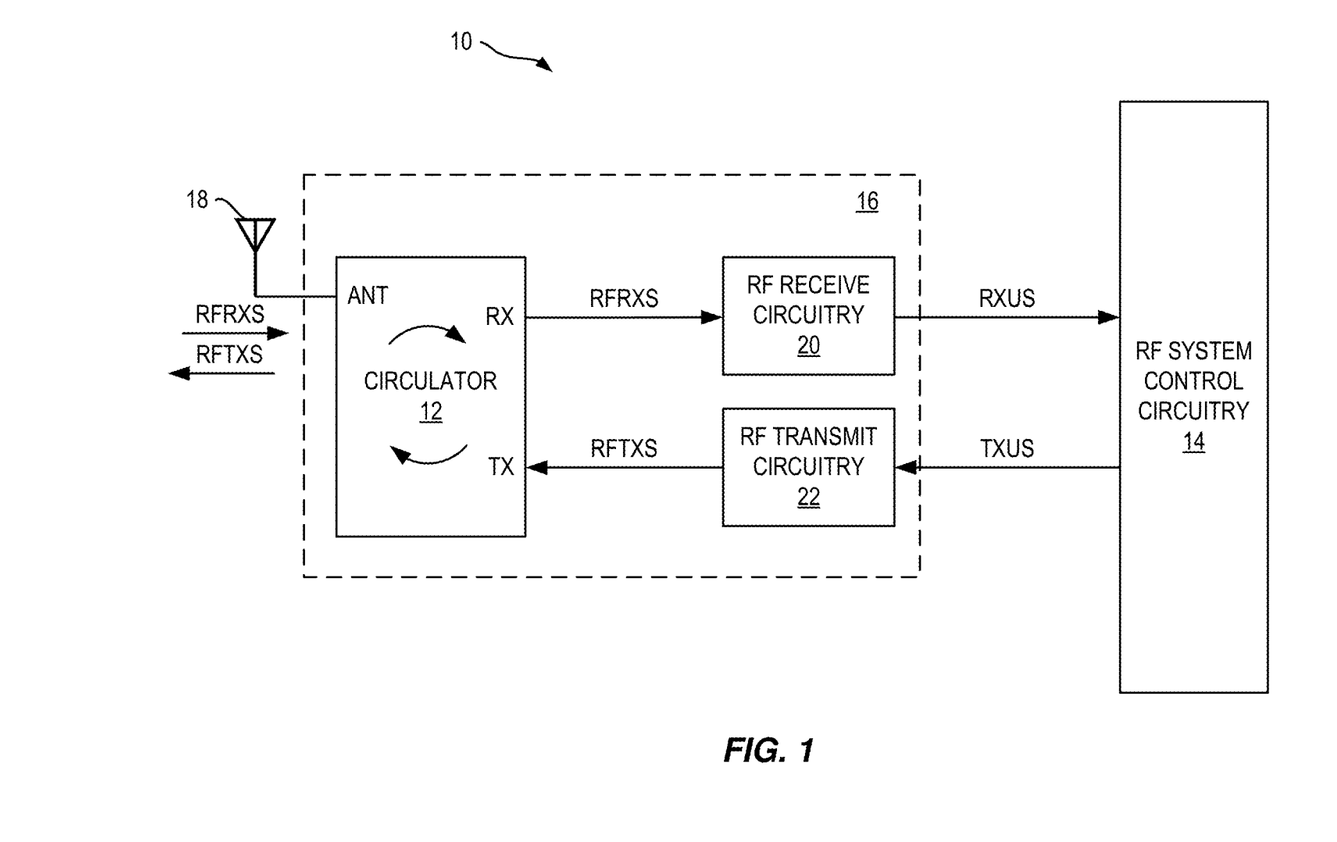
FIG. 1 is a schematic diagram of radio frequency (RF) communications circuitry which includes a self-biased circulator.

FIG. 1 is a schematic diagram of RF communications circuitry 10 which includes a self-biased circulator 12. The RF communications circuitry 10 includes RF system control circuitry 14, RF front-end circuitry 16, and an RF antenna 18. The RF front-end circuitry 16 includes the self-biased circulator 12, RF receive circuitry 20, and RF transmit circuitry 22. The self-biased circulator 12 facilitates simultaneous signal transmission and reception over the RF antenna 18. In this regard, the self-biased circulator 12 facilitates sending an RF transmit signal RFTXS from the RF transmit circuitry 22 to the RF antenna 18 while sending an RF receive signal RFRXS from the RF antenna 18 to the RF receive circuitry 20 (e.g., along a forward direction of the self-biased circulator 12). The self-biased circulator 12 also provides isolation between the RF receive circuitry and RF transmit circuitry 22 (e.g., along a reverse direction of the self-biased circulator 12).

In an exemplary aspect, the RF system control circuitry 14 provides an upstream transmit signal TXUS to the RF transmit circuitry 22. The RF transmit circuitry 22 processes the upstream transmit signal TXUS to provide the RF transmit signal RFTXS to the self-biased circulator 12. The RF transmit circuitry 22 may include up-conversion circuitry, amplification circuitry, power supply circuitry, filtering circuitry, switching circuitry, combining circuitry, splitting circuitry, dividing circuitry, clocking circuitry, the like, or any combination thereof to process the upstream transmit signal TXUS. The self-biased circulator 12, in turn, forwards the RF transmit signal RFTXS to the RF antenna 18 to be transmitted wirelessly.

The self-biased circulator 12 also forwards the RF receive signal RFRXS received wirelessly by the RF antenna 18 to the RF receive circuitry 20. The RF receive circuitry 20 receives and processes the RF receive signal RFRXS to provide an upstream receive signal RXUS. The RF receive circuitry 20 may include down-conversion circuitry, amplification circuitry, low noise amplification circuitry, power supply circuitry, filtering circuitry, switching circuitry, combining circuitry, splitting circuitry, dividing circuitry, clocking circuitry, the like, or any combination thereof. It should be understood that the RF transmit circuitry 22 and the RF receive circuitry 20 are illustrated between the self-biased circulator 12 and the RF system control circuitry 14 for illustrative purposes. In other examples, at least some of the RF transmit circuitry 22 and/or the RF receive circuitry 20 may be positioned between the self-biased circulator 12 and the RF antenna 18.

The self-biased circulator 12 provides a high level of isolation between a receive port RX and a transmit port TX (and, consequently, between the RF receive circuitry 20 and the RF transmit circuitry 22). This may be of particular benefit at the receive port RX (and the RF receive circuitry 20). For example, the RF transmit signal RFTXS may be much higher power than the RF receive signal RFRXS, and the self-biased circulator 12 may prevent damage to sensitive components in the RF receive circuitry 20 from the RF transmit signal RFTXS. In addition, amplifiers in the RF receive circuitry 20 may be prevented from amplifying portions of the RF transmit signal RFTXS, which may drown out or otherwise interfere with processing of the RF receive signal RFRXS.

In embodiments described herein, the self-biased circulator 12 is a double-disc self-biased magnetic circulator which is monolithically integrated in an integrated circuit (e.g., a MMIC). In this regard, the self-biased circulator 12 is monolithically integrated with a portion or all of the RF receive circuitry 20, the RF transmit circuitry 22, and/or the RF system control circuitry 14. That is, the self-biased circulator 12 can be disposed on a common semiconductor wafer with at least some other components of the RF front-end circuitry 16, such as switching elements (e.g., transistors, diodes), filters, amplifiers, logic circuitry, etc.

Figure 2A:
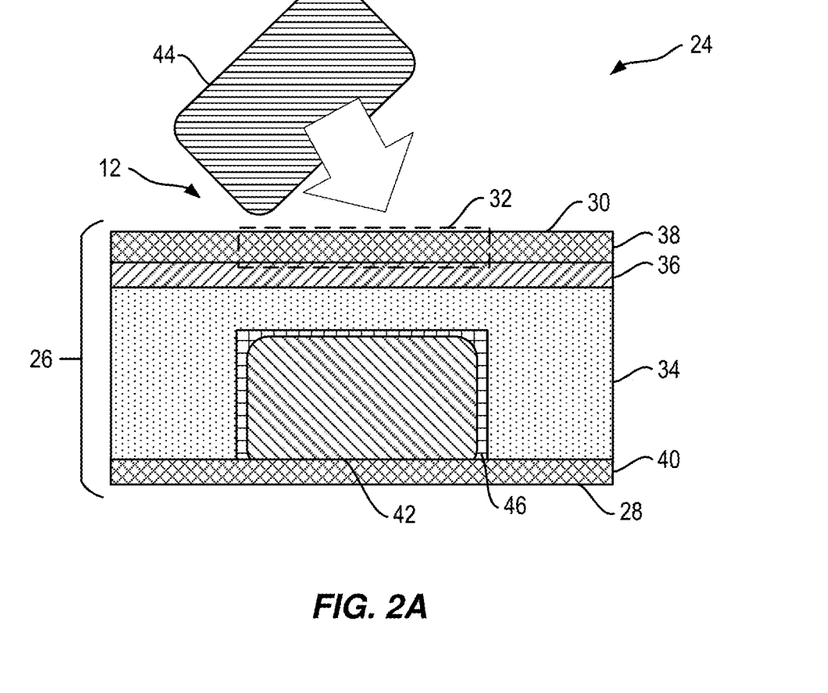
FIG. 2A is a cross-sectional view of an exemplary integrated circuit which includes a double-disc self-biased magnetic circulator.
Figure 2B:
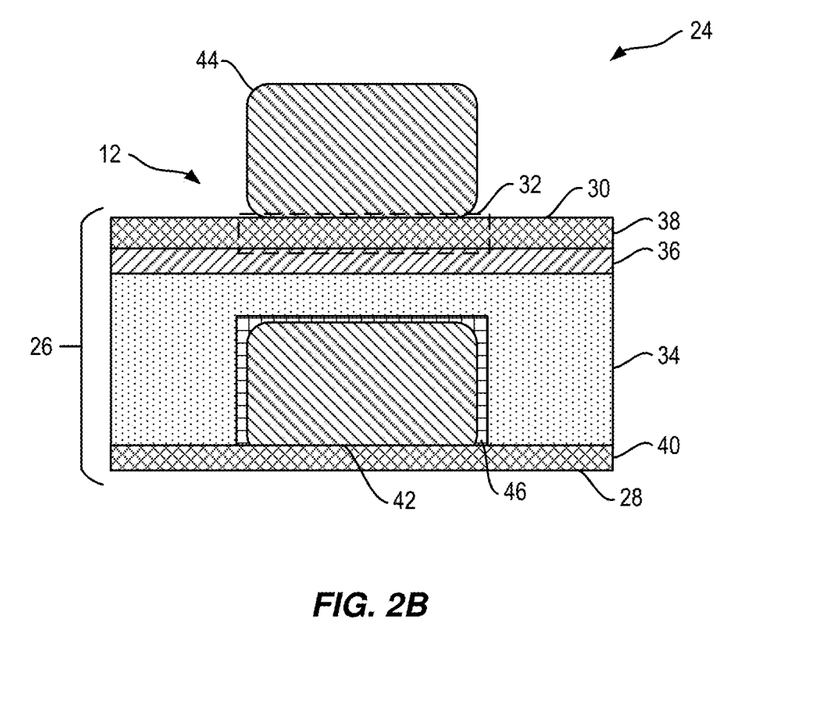
FIG. 2B is another cross-sectional view of the integrated circuit of FIG. 2A.

FIG. 2A is a cross-sectional view of an exemplary integrated circuit 24 which includes a double-disc self-biased magnetic circulator 12. FIG. 2B is another cross-sectional view of the integrated circuit 24 of FIG. 2A. With reference to FIGS. 2A and 2B, the self-biased circulator 12 is disposed in a semiconductor wafer 26 having a bottom surface 28 and a top surface 30. The top surface defines a circulator metal junction 32.

In greater detail, the semiconductor wafer 26 includes a semiconductor substrate 34 (e.g., an insulating substrate, such as an undoped or low-doped semiconductor substrate) and a semiconductor device layer 36 over the semiconductor substrate 34. The semiconductor device layer 36 includes one or more semiconductor devices electrically coupled to the self-biased circulator 12 (e.g., semiconductor devices, such as switching elements, filters, amplifiers, logic circuitry, etc. of the RF receive circuitry 20 and/or the RF transmit circuitry 22 of FIG. 1). The semiconductor wafer 26 can further include a metallization layer 38 over the semiconductor device layer 36, where the metallization layer 38 includes the circulator metal junction 32 and signal lines, contacts, etc. for the one or more semiconductor devices. A ground metallization layer 40 can be disposed on the bottom surface 28 of the semiconductor wafer 26 (e.g., deposited on the bottom of the semiconductor substrate 34). The metallization layer 38 and the ground metallization layer 40 may comprise any suitable metals.

In an exemplary embodiment, the semiconductor substrate 34 is formed with silicon carbide (SiC) and the semiconductor device layer 36 is formed with gallium nitride (GaN). In other embodiments, the semiconductor substrate 34 can be formed from silicon (Si), silicon oxide (SiO$_2$), indium phosphide (InP), gallium arsenide (GaAs), gallium nitride (GaN), or another appropriate semiconductor/insulating material. The semiconductor device layer 36 can be an epitaxial layer formed from gallium arsenide (GaAs), silicon (Si), indium phosphide (InP), or another appropriate semiconductor material. The semiconductor device layer 36 may include multiple epitaxial layers as appropriate to form the one or more semiconductor devices.

The double-disc structure of the self-biased circulator 12 includes a first magnetic disc 42 and a second magnetic disc 44. The first magnetic disc 42 is disposed in a cavity formed in the bottom surface 28 of the semiconductor wafer 26 (e.g., a cavity into the semiconductor substrate 34). In an exemplary aspect, the first magnetic disc 42 is fully embedded within the semiconductor substrate 34. The first magnetic disc 42 can be attached to the semiconductor substrate 34 by a bonding epoxy 46 or another appropriate technique.

The second magnetic disc 44 is coupled to the top surface 30 of the semiconductor wafer 26 and disposed over the first magnetic disc 42. The second magnetic disc 44 can be attached to the top surface 30 through an appropriate technique (such as the same or another epoxy), and may further be monolithically integrated into the integrated circuit 24 using additional layers, such as an overflow insulating layer (not shown). FIG. 2A shows the integrated circuit 24 before the second magnetic disc 44 is attached.

The first magnetic disc 42 and the second magnetic disc 44 can be formed from a ferrite or other ferromagnetic material, such as a magnetic nano-composite (MNC) including at least one of iron-nickel (FeNi) nanowires or iron-cobalt (FeCo) nanowires. The first magnetic disc 42 and the second magnetic disc 44 can be formed in a separate process, singulated by laser dicing or another technique, and coupled to the semiconductor substrate 34 and/or the metallization layer 38, respectively. In some examples, the first magnetic disc 42 and the second magnetic disc 44 can be placed within the cavity and/or on the metallization layer 38, respectively, via growth or deposition, ink jet deposition, screen printing, pick and place, or another appropriate technique.

The size and shape of the first magnetic disc 42 and the second magnetic disc 44 can depend on an operating RF frequency range of the self-biased circulator 12 in the integrated circuit 24. In some examples, the thickness of the first magnetic disc 42 and the second magnetic disc 44 can vary (including the relative thickness), which can result in a different depth of the cavity and/or thickness of the semiconductor substrate 34. In some examples, a length, width, radius, etc. defined transverse to the thickness of the first magnetic disc 42 and the second magnetic disc 44 can vary (e.g., including relative to one another) with or without changes in the thickness of the first magnetic disc 42 and the second magnetic disc 44.

Figure 2C:
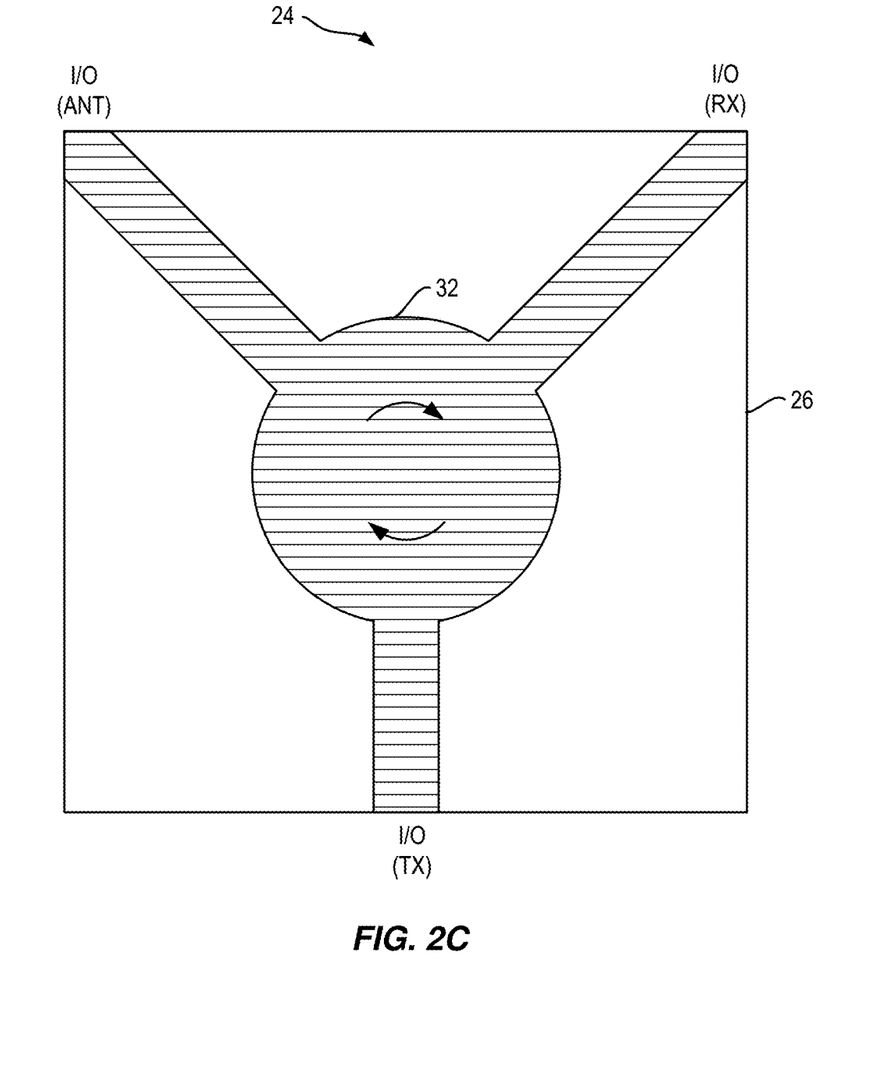
FIG. 2C is a top view of the exemplary integrated circuit of FIG. 2A.

FIG. 2C is a top view of the exemplary integrated circuit 24 of FIG. 2A (that is, before the second magnetic disc 44 is attached). An exemplary circulator metal junction 32 is shown over the semiconductor wafer 26, with three input/output (I/O) ports, each of which may correspond to the antenna port ANT, receive port RX, and transmit port TX, of FIG. 1 according to how they are connected to other circuitry. While a particular pattern is shown for the stripline Y-junction in FIG. 2C, those skilled in the art will readily appreciate that any number of suitable patterns for providing the metallization layer 38 to form a circulator exist, all of which are contemplated herein.

Notably, only the portion of the semiconductor wafer 26 in which the self-biased circulator 12 is formed are shown in FIGS. 2A-2C. The semiconductor substrate 34 and the semiconductor device layer 36 may be part of a semiconductor chip that provides a MMIC such that the self-biased circulator 12 is integrated on the same semiconductor chip as the MMIC. This may significantly reduce the size of a resulting transmit/receive module (e.g., RF communications circuitry 10 as in FIG. 1) incorporating the MMIC.

Figure 3A:
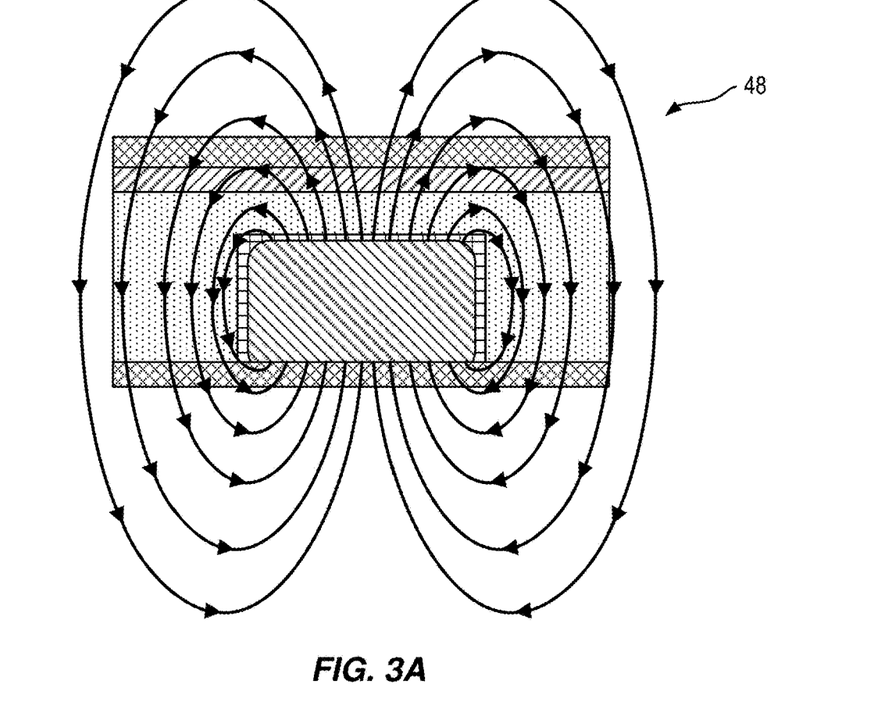
FIG. 3A is a cross-sectional view of a self-biased circulator with a single-disc structure.
Figure 3B:
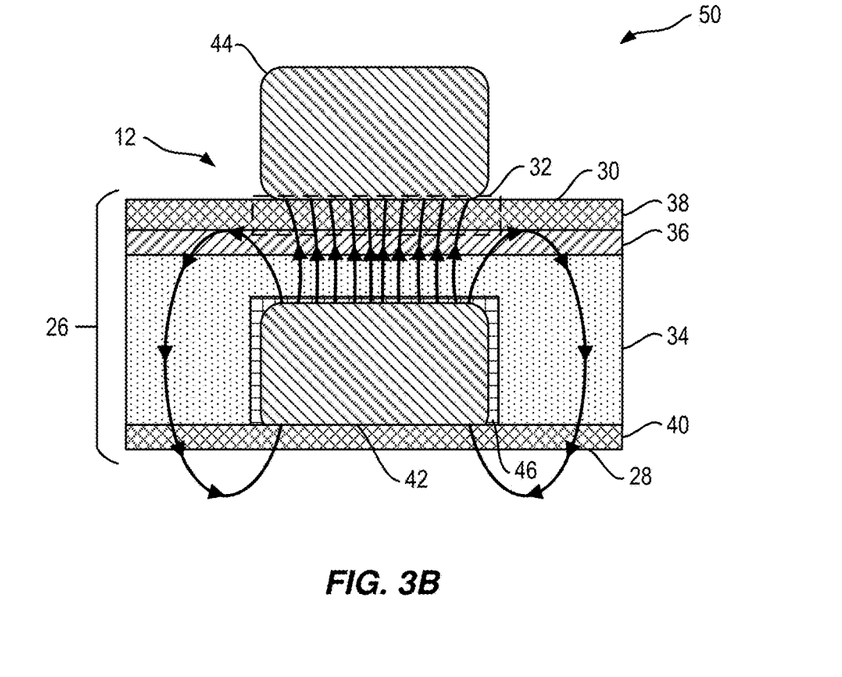
FIG. 3B is a cross-sectional view of a self-biased circulator with a double-disc structure.

FIG. 3A is a cross-sectional view of a self-biased circulator 12 with a single-disc structure 48. FIG. 3B is a cross-sectional view of a self-biased circulator 12 with a double-disc structure 50. FIGS. 3A and 3B illustrate a comparison in magnetic fields generated by the first magnetic disc 42 alone (FIG. 3A) and the first magnetic disc 42 and the second magnetic disc 44 together (FIG. 3B). It should be noted that no permanent magnet exists in either the single-disc structure 48 or the double-disc structure 50. In addition, in the double-disc structure 50 the top disc does not need to be grounded.

The embodiment of FIG. 3B provides particular advantages over the single-disc structure 48 of FIG. 3A. The whole double-disc structure 50 in FIG. 3B is magnetized in a magnetic field so that the magnetic field between the two discs 42, 44 are uniform and perpendicular to the metallization 38 layer, where the RF signal goes through. As a result, the magnetic field between the two discs 42, 44 is more uniform than in the single-disc structure 48, and fringing effects (where the B field curves through the metallization layer 38) of the magnetic field are suppressed.

As will be shown in evaluations below, the insertion loss of the single-disc structure 48 in FIG. 3A increases with a higher input power. The change is much less in the double-disc structure 50 of FIG. 3B, as the magnetic field in the embodiment of FIG. 3B is more stable than that in FIG. 3A. The embodiment of FIG. 3B is also less sensitive to temperature changes in the self-biased material.

In evaluations described below, an embodiment uses a Ka-band self-biased circulator 12 with hexaferrite discs for the first magnetic disc 42 and the second magnetic disc 44. It should be understood that other embodiments can be designed for additional RF bands higher than the Ka band, including the C band, the X band, the V band, the W band, and above.

Figure 4:
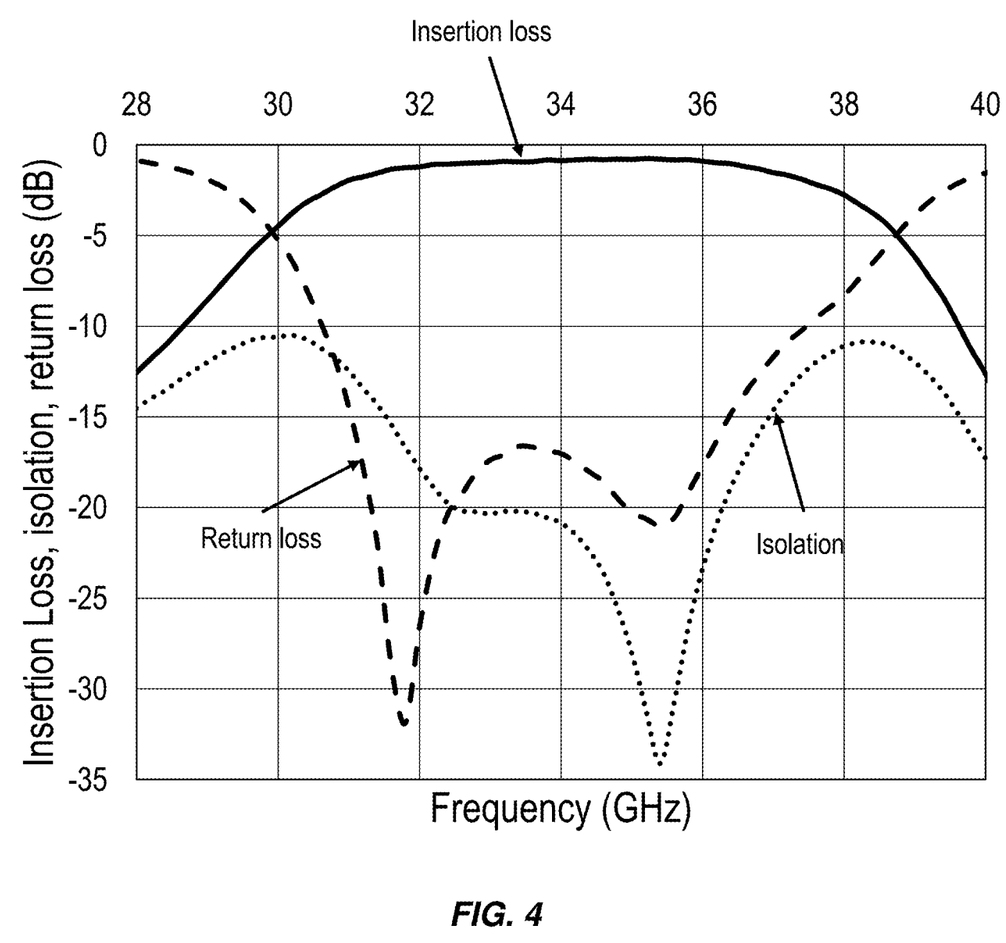
FIG. 4 is a graphical representation of a small signal response of an exemplary embodiment of the double-disc self-biased circulator.

FIG. 4 is a graphical representation of a small signal response of an exemplary embodiment of the double-disc self-biased circulator 12. This figure illustrates a circulation window centering at 34 gigahertz (GHz), an insertion loss of ~ 0.7 decibels (dB), an isolation of over 17 dB, return losses over 17 dB and a bandwidth of more than 14%. In this regard, embodiments of the self-biased circulator 12 provide greater than 15 dB of isolation between reverse pairs (e.g., transmit port TX to receive port RX) of the three I/O ports across a target circulation window at least 2 GHz wide (e.g., 4 GHz wide). Embodiments further provide greater than 15 dB of return loss at each of the three I/O ports across the target circulation window. Embodiments further provide less than 1 dB of insertion loss between forward pairs (e.g., antenna port ANT to receive port RX and transmit port TX to antenna port ANT) of the three I/O ports across the target circulation window.

Figure 5A:
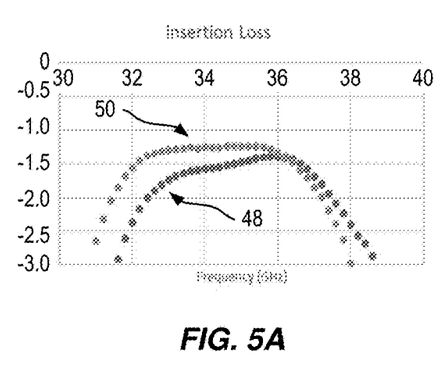
FIGS. 5A-5C are graphical representations of insertion loss in a first device implementing the single-disc structure and the double-disc structure.
Figure 5B:
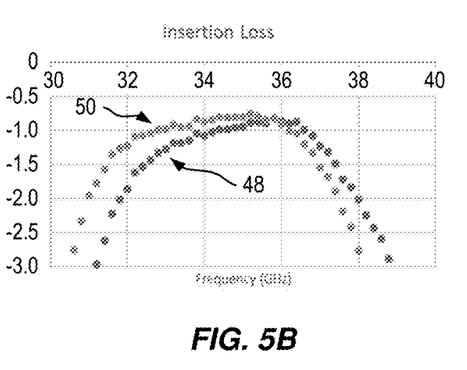
Figure 5C:
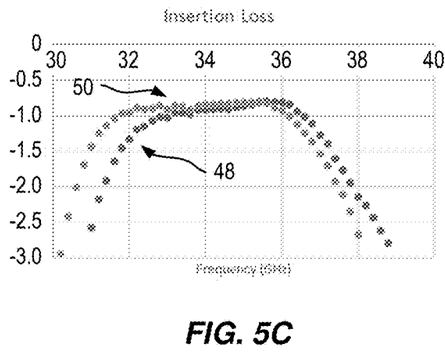
Figure 5D:
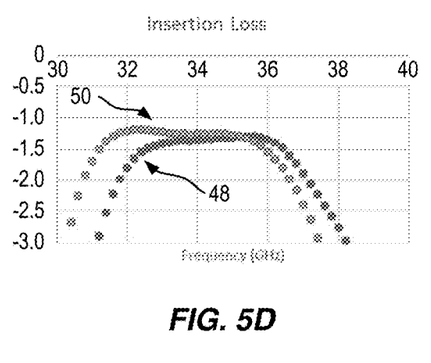
FIGS. 5D-5F are graphical representations of insertion loss in a second device implementing the single-disc structure and the double-disc structure.
Figure 5E:
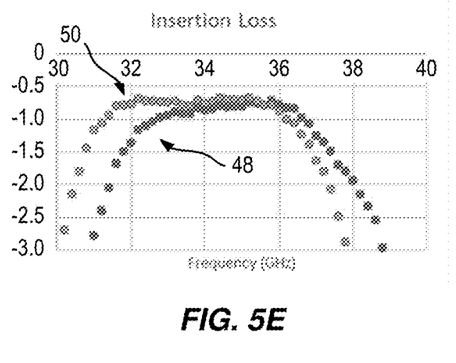
Figure 5F:
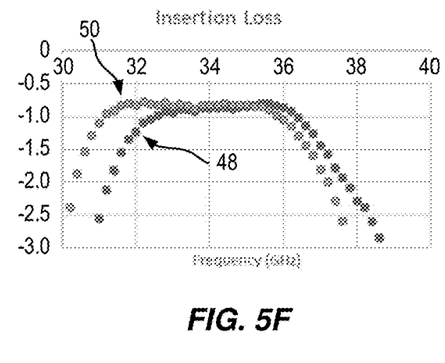

FIGS. 5A-5C are graphical representations of insertion loss in a first device implementing the single-disc structure 48 and the double-disc structure 50. FIGS. 5D-5F are graphical representations of insertion loss in a second device implementing the single-disc structure 48 and the double-disc structure 50. These figures illustrate that the insertion losses are improved at the low band edge. There is a minor band shift towards the low frequency side, which can be readily tuned back by device design.

Figure 6A:
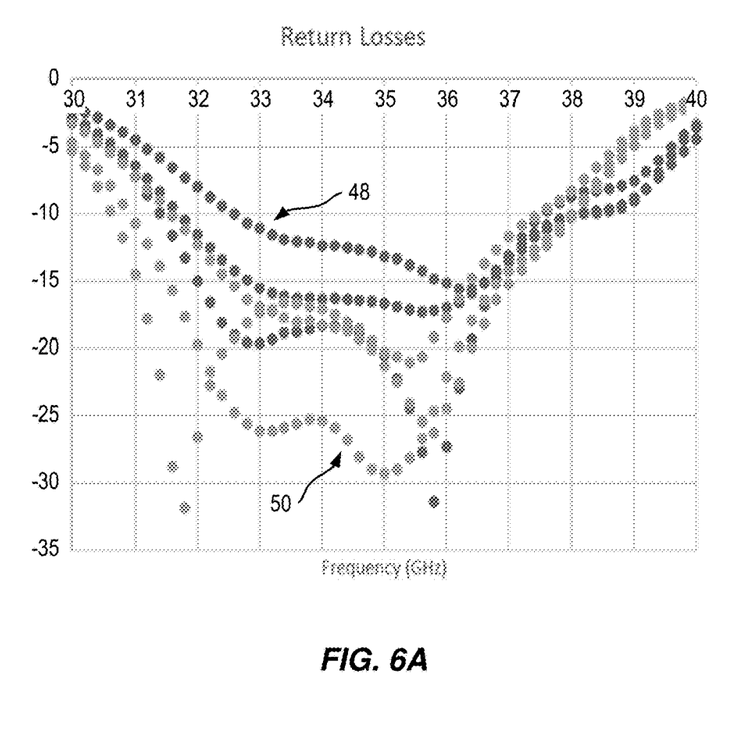
FIGS. 6A and 6B are graphical representations of return losses in a device implementing the single-disc structure and the double-disc structure.
Figure 6B:
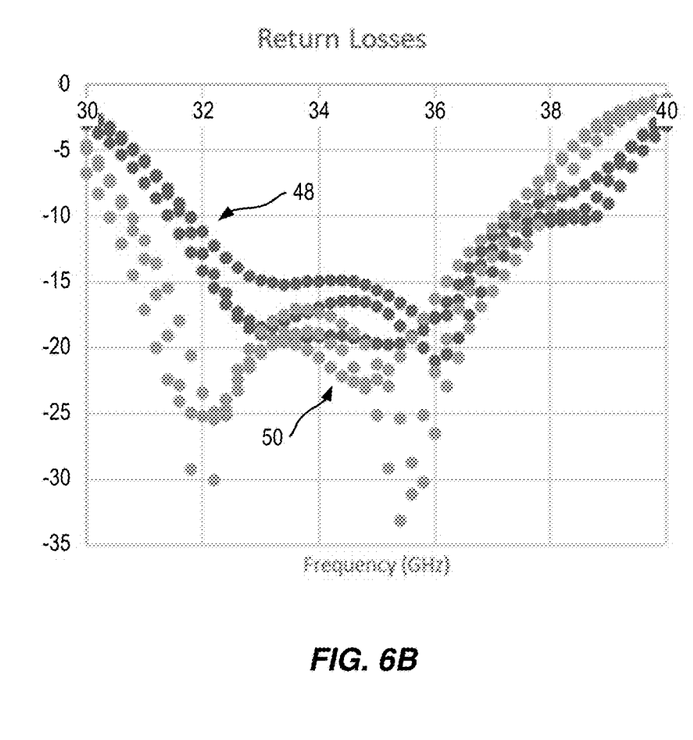

FIGS. 6A and 6B are graphical representations of return losses in a device implementing the single-disc structure 48 and the double-disc structure 50. The return losses have been improved as well by using the double-disc structure 50 compared to the single disc structure 48.

Figure 7A:
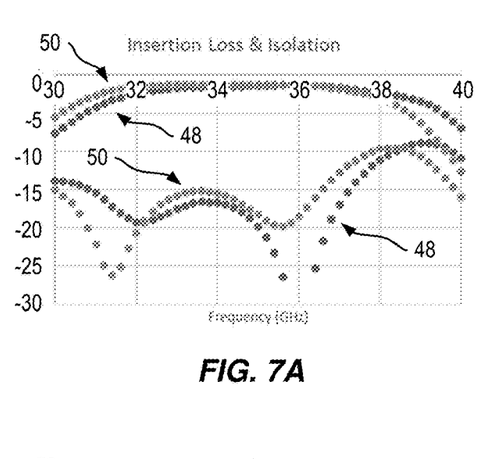
FIGS. 7A-7C are graphical representations of insertion loss and isolation in the first device implementing the single-disc structure and the double-disc structure.
Figure 7B:
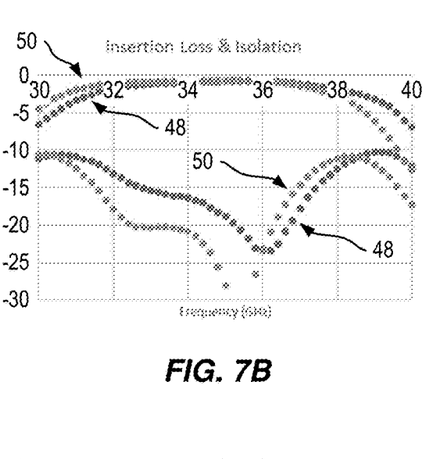
Figure 7C:
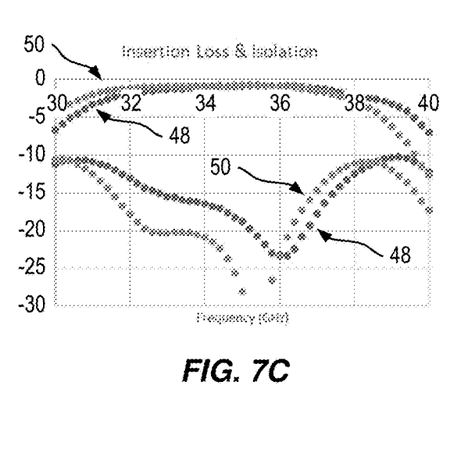
Figure 7D:
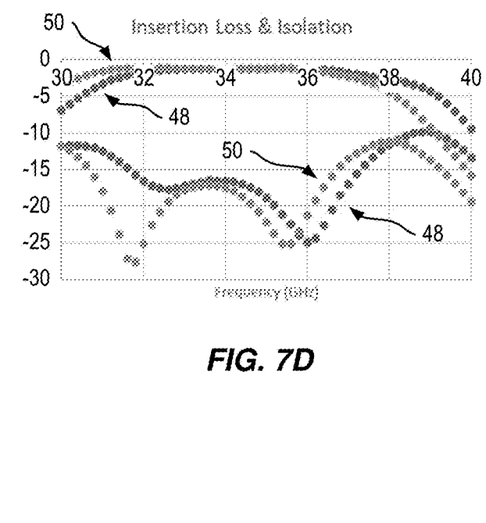
FIGS. 7D-7F are graphical representations of insertion loss and isolation in the second device implementing the single-disc structure and the double-disc structure.
Figure 7E:
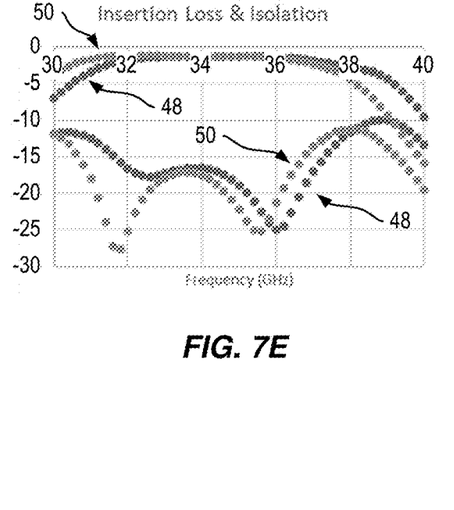
Figure 7F:
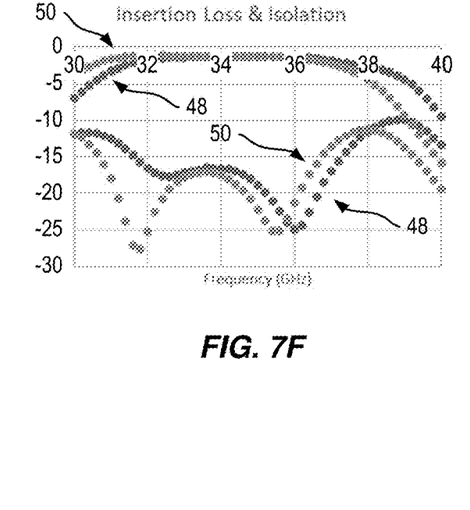

FIGS. 7A-7C are graphical representations of insertion loss and isolation in the first device implementing the single-disc structure 48 and the double-disc structure 50. FIGS. 7D-7F are graphical representations of insertion loss and isolation in the second device implementing the single-disc structure 48 and the double-disc structure 50. The bandwidth of both devices is greatly improved by the double-disc structure 50.

Figure 8A:
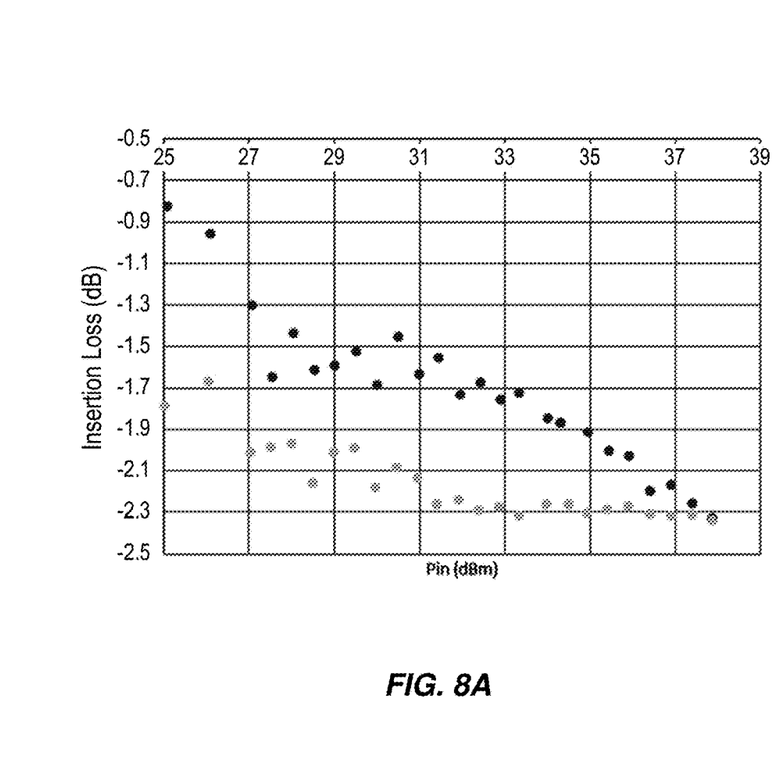
FIG. 8A is a graphical representation of power handling results for the first device implementing the single-disc structure.

FIG. 8A is a graphical representation of power handling results for the first device implementing the single-disc structure 48. Power handling measurements are performed at 35 GHz, with the input power being in the form of a short pulse with a width of 500 nanoseconds (ns) and a 10% duty cycle. The input power Pin was swept from 25 dBm to 38 dBm. In a first scan, the insertion loss increases by 1.5 dB as the Pin increases. In a second scan, the device has obvious degradation with the insertion losses up by 0.9 dB lower than those in the first scan.

Figure 8B:
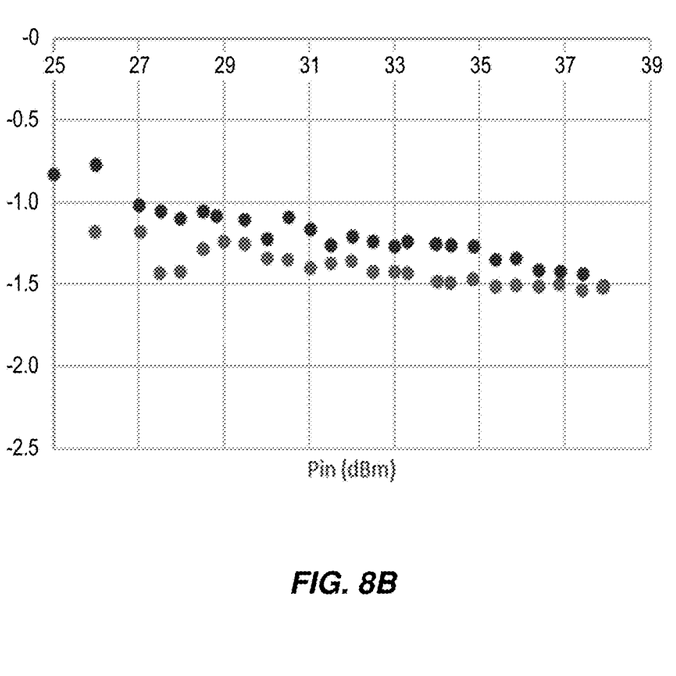
FIG. 8B is a graphical representation of power handling results for the first device implementing the double-disc structure.

FIG. 8B is a graphical representation of power handling results for the first device implementing the double-disc structure 50. The increase of insertion loss as Pin is swept from 25 dBm to 38 dBm is only 0.68 dB compared to 1.5 dB in FIG. 8A. The degradation of insertion loss between two repeated scans also reduces to less than 0.4 dB compared to the up to 1 dB in FIG. 8A. These results indicate the double-disc structure 50 provides better reliability than the single-disc structure 48.

Figure 9:
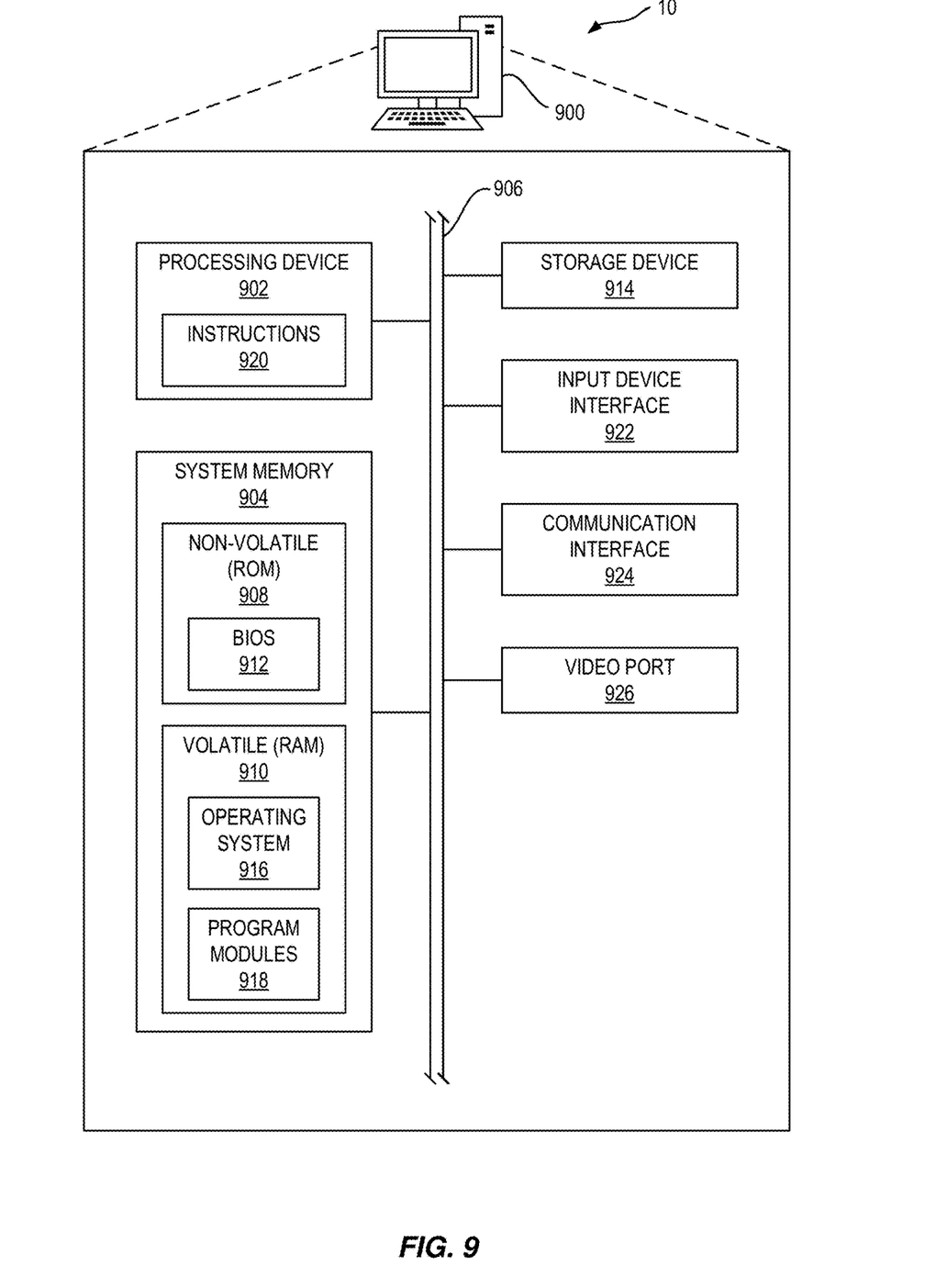
FIG. 9 is a block diagram of the RF communications circuitry suitable for implementing the self-biased circulator according to embodiments disclosed herein.

FIG. 9 is a block diagram of the RF communications circuitry 10 suitable for implementing the self-biased circulator 12 according to embodiments disclosed herein. The RF communications circuitry 10 includes or is implemented as a computer system 900, which comprises any computing or electronic device capable of including firmware, hardware, and/or executing software instructions that could be used to perform any of the methods or functions described above. In this regard, the computer system 900 may be a circuit or circuits included in an electronic board card, such as a printed circuit board (PCB), a server, a personal computer, a desktop computer, a laptop computer, an array of computers, a personal digital assistant (PDA), a computing pad, a mobile device, or any other device, and may represent, for example, a server or a user's computer.

The exemplary computer system 900 in this embodiment includes a processing device 902 or processor, a system memory 904, and a system bus 906. The system memory 904 may include non-volatile memory 908 and volatile memory 910. The non-volatile memory 908 may include read-only memory (ROM), erasable programmable read-only memory (EPROM), electrically erasable programmable read-only memory (EEPROM), and the like. The volatile memory 910 generally includes random-access memory (RAM) (e.g., dynamic random-access memory (DRAM), such as synchronous DRAM (SDRAM)). A basic input/output system (BIOS) 912 may be stored in the non-volatile memory 908 and can include the basic routines that help to transfer information between elements within the computer system 900.

The system bus 906 provides an interface for system components including, but not limited to, the system memory 904 and the processing device 902. The system bus 906 may be any of several types of bus structures that may further interconnect to a memory bus (with or without a memory controller), a peripheral bus, and/or a local bus using any of a variety of commercially available bus architectures.

The processing device 902 represents one or more commercially available or proprietary general-purpose processing devices, such as a microprocessor, central processing unit (CPU), or the like. More particularly, the processing device 902 may be a complex instruction set computing (CISC) microprocessor, a reduced instruction set computing (RISC) microprocessor, a very long instruction word (VLIW) microprocessor, a processor implementing other instruction sets, or other processors implementing a combination of instruction sets. The processing device 902 is configured to execute processing logic instructions for performing the operations and steps discussed herein.

In this regard, the various illustrative logical blocks, modules, and circuits described in connection with the embodiments disclosed herein may be implemented or performed with the processing device 902, which may be a microprocessor, field programmable gate array (FPGA), a digital signal processor (DSP), an application-specific integrated circuit (ASIC), or other programmable logic device, a discrete gate or transistor logic, discrete hardware components, or any combination thereof designed to perform the functions described herein. Furthermore, the processing device 902 may be a microprocessor, or may be any conventional processor, controller, microcontroller, or state machine. The processing device 902 may also be implemented as a combination of computing devices (e.g., a combination of a DSP and a microprocessor, a plurality of microprocessors, one or more microprocessors in conjunction with a DSP core, or any other such configuration).

The computer system 900 may further include or be coupled to a non-transitory computer-readable storage medium, such as a storage device 914, which may represent an internal or external hard disk drive (HDD), flash memory, or the like. The storage device 914 and other drives associated with computer-readable media and computer-usable media may provide non-volatile storage of data, data structures, computer-executable instructions, and the like. Although the description of computer-readable media above refers to an HDD, it should be appreciated that other types of media that are readable by a computer, such as optical disks, magnetic cassettes, flash memory cards, cartridges, and the like, may also be used in the operating environment, and, further, that any such media may contain computer-executable instructions for performing novel methods of the disclosed embodiments.

An operating system 916 and any number of program modules 918 or other applications can be stored in the volatile memory 910, wherein the program modules 918 represent a wide array of computer-executable instructions corresponding to programs, applications, functions, and the like that may implement the functionality described herein in whole or in part, such as through instructions 920 on the processing device 902. The program modules 918 may also reside on the storage mechanism provided by the storage device 914. As such, all or a portion of the functionality described herein may be implemented as a computer program product stored on a transitory or non-transitory computer-usable or computer-readable storage medium, such as the storage device 914, volatile memory 910, non-volatile memory 908, instructions 920, and the like. The computer program product includes complex programming instructions, such as complex computer-readable program code, to cause the processing device 902 to carry out the steps necessary to implement the functions described herein.

An operator, such as the user, may also be able to enter one or more configuration commands to the computer system 900 through a keyboard, a pointing device such as a mouse, or a touch-sensitive surface, such as the display device, via an input device interface 922 or remotely through a web interface, terminal program, or the like via a communication interface 924. The communication interface 924 may be wired or wireless and facilitate communications with any number of devices via a communications network in a direct or indirect fashion. In an exemplary aspect, the RF front end circuitry 16 of FIG. 1 provides the communication interface 924. An output device, such as a display device, can be coupled to the system bus 906 and driven by a video port 926. Additional inputs and outputs to the computer system 900 may be provided through the system bus 906 as appropriate to implement embodiments described herein.

The operational steps described in any of the exemplary embodiments herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary embodiments may be combined.

Those skilled in the art will recognize improvements and modifications to the preferred embodiments of the present disclosure. All such improvements and modifications are considered within the scope of the concepts disclosed herein and the claims that follow.

What is claimed is:

1. A self-biased magnetic circulator, comprising:
   a semiconductor wafer comprising a bottom surface and a top surface defining a circulator metal junction;
   a first magnetic disc disposed in a cavity formed in the bottom surface of the semiconductor wafer; and
   a second magnetic disc coupled to the top surface of the semiconductor wafer and disposed over the first magnetic disc.

2. The self-biased magnetic circulator of claim 1, wherein the second magnetic disc is positioned over the first magnetic disc such that a fringing effect of a magnetic field through the semiconductor wafer is suppressed.

3. The self-biased magnetic circulator of claim 1, wherein each of the first magnetic disc and the second magnetic disc comprises a magnetized ferrite material.

4. The self-biased magnetic circulator of claim 1, wherein the semiconductor wafer comprises a semiconductor substrate and a semiconductor device layer disposed over the semiconductor substrate.

5. The self-biased magnetic circulator of claim 4, wherein the semiconductor substrate comprises silicon carbide and the semiconductor device layer comprises gallium nitride.

6. The self-biased magnetic circulator of claim 4, wherein the semiconductor wafer further comprises a metallization layer over the semiconductor device layer and comprising the circulator metal junction.

7. The self-biased magnetic circulator of claim 4, wherein the cavity formed in the bottom surface of the semiconductor wafer is a cavity into the semiconductor substrate.

8. The self-biased magnetic circulator of claim 7, further comprising an epoxy bonding the first magnetic disc to the semiconductor substrate.

9. The self-biased magnetic circulator of claim 7, further comprising a ground metallization layer disposed over the bottom surface.

10. The self-biased magnetic circulator of claim 1, wherein the self-biased magnetic circulator defines a circulator window in a C band, an X band, a Ka band, or a V band of radio frequency (RF) signals.

11. The self-biased magnetic circulator of claim 1, wherein the circulator metal junction comprises three input/output (I/O) ports of the self-biased magnetic circulator.

12. The self-biased magnetic circulator of claim 11, wherein the self-biased magnetic circulator provides greater than 15 decibels (dB) of isolation between reverse pairs of the three I/O ports across a target circulation window at least 2 gigahertz (GHz) wide.

13. The self-biased magnetic circulator of claim 12, wherein the self-biased magnetic circulator further provides greater than 15 dB of return loss at each of the three I/O ports across the target circulation window.

14. The self-biased magnetic circulator of claim 13, wherein the self-biased magnetic circulator further provides less than 1 dB of insertion loss between forward pairs of the three I/O ports across the target circulation window.

15. An integrated circuit, comprising:
- a semiconductor device layer disposed on an insulating substrate;
- a metallization layer over the semiconductor device layer; and
- a double-disc magnetic circulator, comprising:
    - a first magnetic disc disposed in a cavity formed in the insulating substrate; and
    - a second magnetic disc disposed over the first magnetic disc and over the metallization layer.

16. The integrated circuit of claim 15, wherein the double-disc magnetic circulator further comprises an antenna port, a receive port, and a transmit port, each of which is formed in the metallization layer.

17. The integrated circuit of claim 16, wherein the semiconductor device layer comprises one or more receive circuitry components coupled to the receive port of the double-disc magnetic circulator.

18. The integrated circuit of claim 17, wherein the semiconductor device layer further comprises one or more transmit circuitry components coupled to the transmit port of the double-disc magnetic circulator.

19. The integrated circuit of claim 18, wherein the double-disc magnetic circulator, the one or more receive circuitry components, and the one or more transmit circuitry components comprise a radio frequency (RF) front end disposed on a common semiconductor wafer.

20. The integrated circuit of claim 18, wherein the double-disc magnetic circulator provides greater than 15 decibels (dB) isolation between the one or more receive circuitry components and the one or more transmit circuitry components across a target circulation window at least 2 gigahertz (GHz) wide.

* * * * *